United States Patent
Boos

(10) Patent No.: US 7,555,272 B2
(45) Date of Patent: Jun. 30, 2009

(54) TRANSMISSION ARRANGEMENT FOR TRANSMITTING DATA CONTINUOUSLY IN THE TIME DOMAIN

(75) Inventor: Zdravko Boos, Munich (DE)

(73) Assignee: Infineon Technologies AG, Munich (DE)

(*) Notice: Subject to any disclaimer, the term of this patent is extended or adjusted under 35 U.S.C. 154(b) by 887 days.

(21) Appl. No.: 10/872,815

(22) Filed: Jun. 21, 2004

(65) Prior Publication Data

US 2005/0032489 A1    Feb. 10, 2005

Related U.S. Application Data

(60) Provisional application No. PCT/DE02/04624, filed on Dec. 17, 2002.

(30) Foreign Application Priority Data

Dec. 21, 2001  (DE) ................. 101 63 466

(51) Int. Cl.
*H01Q 11/12* (2006.01)
*H04B 1/04* (2006.01)

(52) U.S. Cl. ............ 455/127.2; 455/119; 375/297; 375/295

(58) Field of Classification Search ........... 455/127.1, 455/127.2, 126, 119; 375/298, 295, 345, 375/296, 297, 299, 300, 310, 311, 312, 313, 375/314, 315
See application file for complete search history.

(56) References Cited

U.S. PATENT DOCUMENTS

| 5,029,233 | A | * | 7/1991 | Metroka | ................. 455/552.1 |
|---|---|---|---|---|---|
| 5,066,923 | A | * | 11/1991 | Gailus et al. | ................. 330/107 |
| 5,307,512 | A | | 4/1994 | Mitzlaff | |
| 5,333,175 | A | | 7/1994 | Ariyavisitakul et al. | |
| 5,677,962 | A | * | 10/1997 | Harrison et al. | ............. 381/109 |
| 5,708,681 | A | | 1/1998 | Malkemes et al. | |
| 5,745,480 | A | | 4/1998 | Behtash et al. | |
| 5,805,986 | A | | 9/1998 | Mizusawa et al. | |
| 5,872,481 | A | | 2/1999 | Sevic et al. | |
| 6,370,203 | B1 | | 4/2002 | Boesch et al. | |
| 6,466,628 | B1 | | 10/2002 | Kim | |
| 6,639,950 | B1 | * | 10/2003 | Lagerblom et al. | ......... 375/297 |
| 7,110,727 | B2 | * | 9/2006 | Dekker | ................. 455/91 |
| 7,164,893 | B2 | * | 1/2007 | Leizerovich et al. | ..... 455/127.1 |

FOREIGN PATENT DOCUMENTS

| DE | 42 91 711 C2 | 3/1998 |
|---|---|---|
| GB | 2 344 007 A | 5/2000 |
| JP | 06-303145 | 10/1994 |
| JP | 09-008578 | 1/1997 |
| JP | 09-232890 | 9/1997 |
| JP | 2000-78036 | 3/2000 |
| WO | WO 98/26503 | 6/1998 |

* cited by examiner

*Primary Examiner*—Edward Urban
*Assistant Examiner*—Christian A Hannon
(74) *Attorney, Agent, or Firm*—Slater & Matsil, L.L.P.

(57) ABSTRACT

A transmission arrangement is provided for transmitting data continuously in the time domain. The arrangement includes at least one programmable amplifier in the baseband or in the radio frequency path in the signal processing chain for the signal which is to be transmitted. This programmable amplifier is distinguished in that the signal which actuates the programmable amplifier is a discrete-value signal. By dispensing with complex digital/analog converters, the principle described allows markedly reduced power consumption in transmitters which use code multiple access methods.

19 Claims, 3 Drawing Sheets

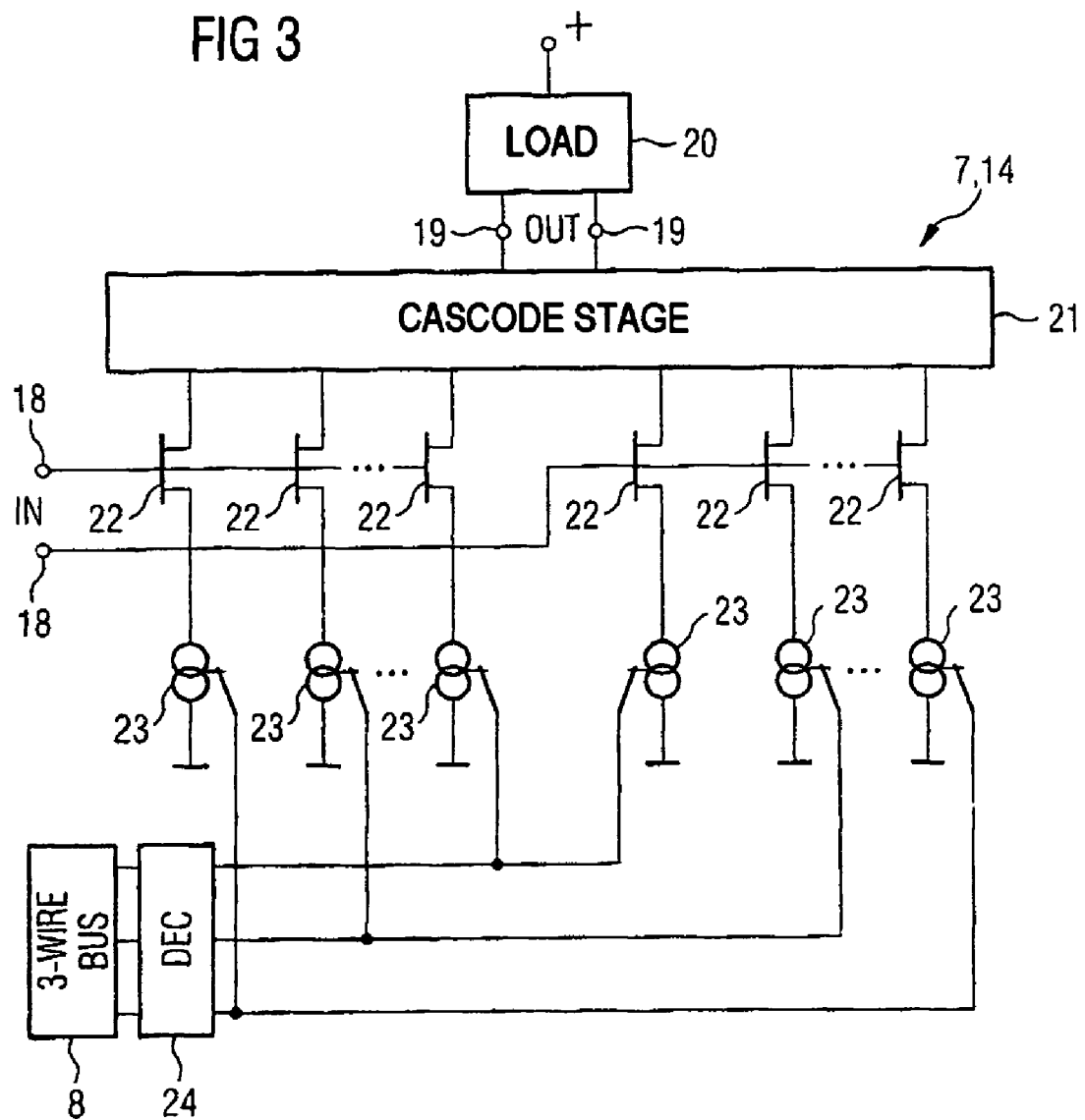

US 7,555,272 B2

TRANSMISSION ARRANGEMENT FOR TRANSMITTING DATA CONTINUOUSLY IN THE TIME DOMAIN

This application is a continuation of PCT application PCT/DE02/04624, filed on Dec. 17, 2002 and published in German on Jul. 10, 2003, which application claims priority to German patent application 101 63 466.8, filed Dec. 21, 2001. Both of these applications are incorporated herein by reference.

TECHNICAL FIELD

The present invention relates to a transmission arrangement for transmitting data continuously in the time domain.

BACKGROUND

While second generation mobile radios do not transmit continuously in the time domain, but rather in time windows ("bursts"), modern transmission methods, for example based on the Universal Mobile Telecommunications System (UMTS) standard, use transmission methods, which are continuous in the time domain.

In the UMTS standard, the multiple access method used is Code Division Multiple Access or CDMA. In this case, the mobile radio transmitter needs to be capable of transmitting continuously in the time domain without interruption. In addition, such mobile radios need to satisfy very stringent demands on the control range for the transmission power and hence on the control range for the power amplifier and also, additionally, the accuracy of the gain control. As a result, they differ significantly from the combinations of time and frequency division multiple access methods (TDMA, Time Division Multiple Access, and FDMA, Frequency Division Multiple Access) used to date, for example in the GSM (Global System for Mobile Communication).

UMT mobile radios need to be capable of continuously matching the transmission power during a data transmission to the changing circumstances. In this case, the transmission power may be dependent on the present reception field strength of the mobile part or may be prescribed by a fixed station.

Since, in addition to the power control in the course of a data transmission, such CDMA appliances require that particular demands on the magnitude of error vectors and on the transmission frequency spectrum be satisfied over the entire dynamic range, currently known mobile radios designed for transmitting data continuously in the time domain have an automatic gain control, AGC, which is distinguished in that the control signal for the AGC elements used is a continuous-value analog signal. This ensures that the transmission power during the uninterrupted transmission mode can be readjusted without infringing limit values for the respective standards.

However, the actuation of such AGC elements has the drawback of a relatively large power requirement for the necessary digital/analog converters, requires additional chip surface, results in relatively high susceptibility to interference in the analog control signals and thus means relatively high costs overall for designing and producing such appliances.

U.S. Pat. No. 5,708,681 specifies a radio transceiver in which the transmission path contains a power amplifier which is connected downstream of a quadrature modulator. The transmission power is influenced using a control block, which controls the gain of the power amplifier on the basis of a control signal, which is present in digital form.

SUMMARY OF THE INVENTION

In one aspect, the present invention specifies a transmission arrangement for transmitting data continuously in the time domain. This transmission arrangement is suitable for UMTS and provides improvements in terms of power consumption.

The preferred embodiment of the invention provides a transmission arrangement for transmitting data continuously in the time domain. For example, one embodiment includes:
  a baseband signal processing unit, designed for complex-value signal processing having an in-phase and a quadrature signal path,
  a quadrature modulator having a first input, which is coupled to the in-phase signal path, having a second input, which is coupled to the quadrature signal path, and having an output,
  a radio frequency path, which is coupled to the output of the quadrature modulator,
  a control unit, which provides a discrete-value control signal for influencing the transmission power of the transmission arrangement,
  a first programmable amplifier, which is arranged in the baseband signal processing unit in order to amplify the useful signal which is to be transmitted using an adjustable gain factor, having a control input which is coupled to the control unit in order to transmit the discrete-value control signal, comprising an amplifier component which is arranged in the in-phase signal path and an amplifier component which is arranged in the quadrature signal path, and
  a second programmable amplifier, which is arranged in the radio frequency path, comprising a control input which is coupled to the control unit in order to transmit a discrete-value control signal.

In line with the present principle, the transmission power of the transmission arrangement is influenced by using at least one programmable amplifier, which is actuated using a discrete-value control signal. Unlike the automatic gain controls (AGCs) that are usually used and that are actuated using continuous-value analog signals for gain control, the actuation in the present, programmable amplifier is effected using a discrete-value control signal for controlling the amplitude gain in the transmission arrangement.

The present principle for the design of a transmission arrangement for transmitting data continuously in the time domain is based on the insight that when transmitting data continuously in the time domain while simultaneously satisfying specification limit values, particularly in relation to the radio frequency spectrum and the magnitude of error vectors, it is still possible to dispense with automatic gain control actuated using continuous values.

Since the control voltage for the gain control in the digital signal processors in the baseband of such a transmission arrangement is normally present in digital form, that is to say at discrete times and values, anyway, the present principle advantageously allows digital/analog converters to be dispensed with. Such a voltage signal is normally derived, in the baseband signal processing unit, on the basis of the present reception field strength, the "received signal strength indicator", RSSI. With the D/A converter, it is also possible to dispense with downstream filters for reconstructing the analog control signal.

Dispensing with the D/A converters affords a significantly lower power requirement and also additionally a significant reduction in the chip surface, which is required for the baseband signal processing unit, which can be integrated in a baseband IC (Integrated Circuit), for example.

The digital data format of the control signal has the additional advantage that an improvement in the susceptibility to interference is attained compared to an analog signal.

With a suitable design, it is also possible to achieve a marked increase in the accuracy of the transmission power control, for example in a mobile part containing the transmission arrangement. The exclusively digital signal processing of the control signal (which is possible in line with the present principle) in order to influence the transmission power, for example on the basis of the present reception field strength and on the basis of prescribed signals from a base station, means that this control signal is insensitive toward temperature influences, substrate noise which would influence the D/A converters, fluctuations in the operating voltage and also production variations. In the case of a transmitter which is designed for complex-value signal processing and in which the demands on the pairing tolerances of the elements used in the complementary signal paths are very great, an additional advantage is attained through the use of discrete-value actuation of the programmable amplifier.

Finally, the advantageous properties of the present principle, such as reducing the chip surface, increasing the robustness toward interference and other environmental influences, reducing the number of necessary pins on the ICs and also the power reduction, additionally result in a marked reduction in cost. This in turn favors the mass production, which is usual in the present sector.

In line with the principle described, besides the programmable amplifier produced the first programmable amplifier there is an additional second programmable amplifier provided, one of these being arranged in the baseband signal processing unit and one being arranged in the radio frequency path. In this case, the first programmable amplifier, which is arranged in the baseband, is naturally provided both in the in-phase and in the quadrature signal path.

The programmable amplifiers described are respectively actuated using a discrete-value control signal.

The distribution of the signal gain over the baseband and the radio frequency path allows a particularly high level of flexibility in the design of the amplification stages and in the alignment of the timing. In addition, the option of being able to combine baseband ICs and radio frequency ICs of different types or from different manufacturers is advantageously attained.

Since, in line with the UMTS specification, class 3 appliances provide a gain control range in the transmitter of at least 74 dB, this great dynamic range can advantageously be distributed over two amplification stages, one arranged in the baseband and one arranged in the radio frequency path.

Preferably, that programmable amplifier which is arranged in the baseband can bring about a gain having a dynamic range of between 20 and 30 dB, while the gain in the radio frequency path preferably has a dynamic range of between 50 and 60 dB.

The transmission arrangement may preferably have a passive, programmable amplifier in the baseband signal processing unit or in the radio frequency path, having a control input which is coupled to the control unit in order to provide discrete-value signal attenuation.

The passive, programmable amplifier may be in the form of a resistor network.

The passive, programmable amplifier attenuates the signal, which is to be transmitted. In this case, the attenuation can be adjusted in discrete-value steps. Such passive control makes it possible to attain a reduction in the power consumption and also just low substrate noise without reducing the dynamic range of the transmitter.

The passive, programmable amplifier is preferably connected to the output of the quadrature modulator.

The passive, programmable amplifier at the output of the quadrature modulator is preferably connected upstream of an active, programmable amplifier.

Preferably, the passive, programmable amplifier can be adjusted in steps of 6 dB. The first, active, programmable amplifier in the baseband signal processing unit can preferably be adjusted in steps of 1 dB. The second, active, programmable amplifier in the radio frequency path can preferably be adjusted in steps of 6 dB.

In order to reduce the power requirement of the transmission arrangement further, the programmable amplifier comprises a plurality of parallel-connected amplifier paths, which can be connected and disconnected independently of one another, the amplifier paths being connected and disconnected on the basis of the discrete-value control signal.

The respective amplifier paths which are not needed can be disconnected, that is to say that their current sources are deactivated, which means that the power requirement of the programmable, active amplifier or of the programmable amplifiers falls. Since a transmission arrangement, for example in mobile radio, normally does not operate at maximum transmission power for the majority of the operating period, the described splitting of the programmable amplifier over a plurality of paths which can be connected and disconnected independently of one another allows a marked reduction in power consumption.

In line with another, preferred embodiment of the present invention, the programmable amplifier has a means for setting the rise time of the gain factor. The means for setting the rise time makes it possible to change over the programmable amplifier from one amplification stage to another amplification stage without abruptly altering the gain factor, but instead allows a soft transition. As a result, unwanted radio frequency signal components are significantly reduced during changeover and, in addition, the amplitude of the error vector for the changeover is also reduced.

In this case, the control signal for actuating a programmable amplifier developed in such a manner is also a discrete-value control signal.

In line with another, preferred embodiment of the present invention, a feedback loop for carrier frequency suppression is provided, having a feedback path, which couples the output of the quadrature modulator to its in-phase and its quadrature signal input. Such a feedback loop can detect the amplitude of, by way of example, frequency components at the carrier frequency which arise as interference signals at the output of the modulator, and can act on the signal components, which can be supplied at the input of the quadrature modulator, in terms of DC voltage offsets between the symmetrical components in the in-phase path and/or quadrature path such that the carrier frequency disappears or is as low as possible.

The transmission arrangement is preferably provided in a mobile radio transmitter.

BRIEF DESCRIPTION OF THE DRAWINGS

The invention is explained in more detail below using a plurality of exemplary embodiments with reference to the drawings, in which:

FIG. 3 shows a simplified block diagram of an exemplary, programmable amplifier for use in transmission arrangements as shown in FIG. 1 or 2.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
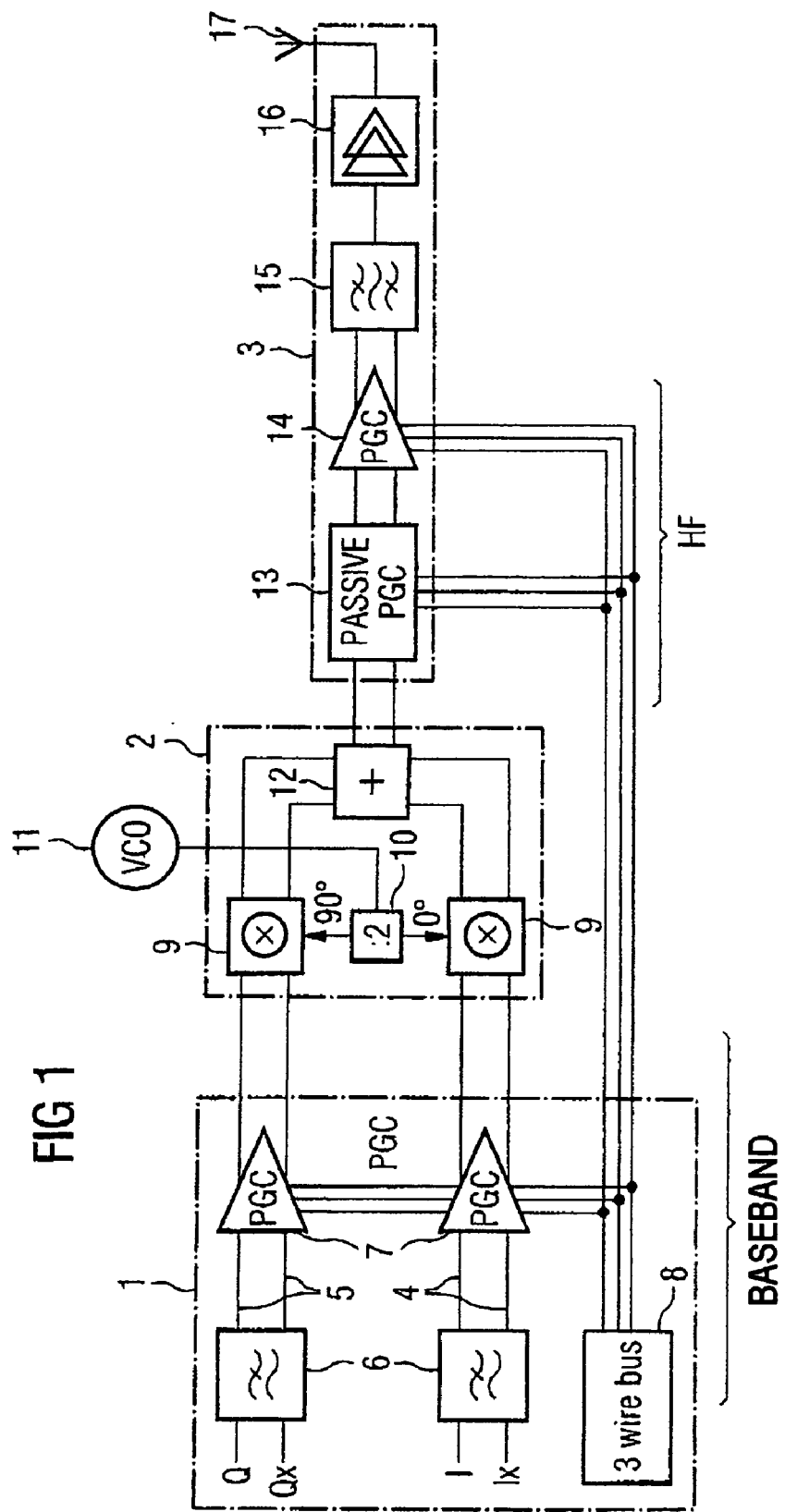
FIG. 1 shows a simplified block diagram with selected elements of an exemplary transmission arrangement in line with the present principle.

FIG. 1 shows a transmission arrangement designed for transmitting data continuously in the time domain. This transmission arrangement includes a baseband signal processing unit 1, a quadrature modulator 2 and a radio frequency path 3. The baseband signal processing unit 1 is designed for complex-value signal processing and, for this, comprises an in-phase path 4 and a quadrature signal path 5.

The in-phase and quadrature signal paths 4, 5 are respectively designed for transmitting symmetrical signals. The in-phase and quadrature signal paths 4, 5 each have a low pass filter 6, each of which has a first programmable amplifier 7 coupled downstream of it. The first programmable amplifiers 7 each have a control input for supplying a discrete-value control signal. The control input is coupled to the output of a control unit 8 by means of a digital three-conductor bus based on the 3Wire Bus Specification. The outputs of the first programmable amplifiers 7 have a quadrature modulator 2 coupled to them.

The quadrature modulator 2 comprises two Gilbert multipliers 9 whose first input pair is coupled to a respective output on a respective first programmable amplifier 7 and whose second input pair is coupled via a 0 degree/90 degree frequency divider 10 to a voltage-controlled oscillator 11 in order to provide a complex-value signal at a carrier frequency. The outputs of the two Gilbert multipliers 9 are coupled to a respective input pair at a summation node 12, whose output forms the output of the quadrature modulator 2. The output of the quadrature modulator 2 has the radio frequency path 3 coupled to it.

The radio frequency path includes a passive, programmable amplifier 13, a second programmable amplifier 14, a bandpass filter 15 and a power amplifier 16. The power amplifier 16 has an output which simultaneously forms the output of the radio frequency path 3 and which is coupled to an antenna 17. The passive, programmable amplifier 13 has its input coupled to the symmetrically designed output of the summation node 12. The output of the passive, programmable amplifier 13 is coupled to the input of the second programmable amplifier 14, which is an active amplifier. The output of the second programmable amplifier 14 has a bandpass filter 15 coupled to it. The output of the bandpass filter 15 is coupled to an input on the power amplifier 16. Both the passive, programmable amplifier 13 and the second programmable amplifier 14 are connected to the control unit 8 by means of the three-conductor bus in order to control them.

The described transmission arrangement for transmitting data continuously in the time domain is accordingly in the form of a Homodyn transmitter or direct converter.

The programmable amplifiers 7, 13, 14 are actuated by the control unit 8 using discrete-value signals. The transmission arrangement is designed for transmitting data continuously in the time domain using CDMA and is in the form of a UMTS transmitter. Such mobile radios based on the UMTS standard are normally provided not only with the transmission path shown but also with a reception path (not shown in FIG. 1) in order to form a transceiver.

The total, controllable gain of the transmission arrangement is distributed over two active, programmable amplifier stages 7, 14 and one passive, programmable amplifier stage 13 in order to attain a wide dynamic range. In this case, a gain control in the range between approximately 20 and 30 dB is attained in the baseband signal processing unit 1, while a dynamic range of between approximately 50 and 60 dB is provided as the control range in the radio frequency path 3. Since a power level of approximately −10 dBm is advantageously intended to prevail at the output of the quadrature modulator, a gain control range of between approximately +15 and −45 dB should be provided at the output of the quadrature modulator 2. This advantageously allows the use of a passive, programmable amplification stage 13, which is in the form of a controllable resistor network in the present exemplary embodiment.

In the exemplary embodiment described, the passive, programmable amplifier 13 and the second programmable amplifier 14 can each be adjusted in steps of 6 dB. The first programmable amplifier 7 in the baseband can be adjusted in discrete steps of 1 dB. The gain factors of the amplifiers 7, 13, 14 are thus not adjustable using continuous values, as is normally provided in the case of continuous data transmission systems, but rather can be adjusted using discrete values. The described combination of baseband and radio frequency gain control makes it possible to attain, overall, a resolution for the gain control of 1 dB through suitable actuation amplifiers 7, 13, 14 using the control unit 8 and discrete-value control signals.

Despite the discrete-value gain control, the present transmission arrangement makes it possible to observe the demands prescribed for CDMA transmitters in terms of the radio frequency spectral content of the transmitter signals and the required magnitude of the error vectors. This is facilitated even more by virtue of the programmable amplifiers 13, 14 having an adjustable rise time for their pulses. The rise time in the baseband is inherently longer if baseband filters are provided. In the radio frequency path, however, a controllable rise time is provided such that it matches the rise time of the amplifiers in the baseband. All in all, it is therefore possible to meet the error vector magnitude, limited to 17.5% in the case of UMTS, without any difficulty.

The transmission arrangement based on the exemplary embodiment described can be used both in second generation mobile radio systems using CDMA, in third generation mobile radio systems and also in future generations of mobile radio systems, such as in the planned fourth generation.

Figure 2:
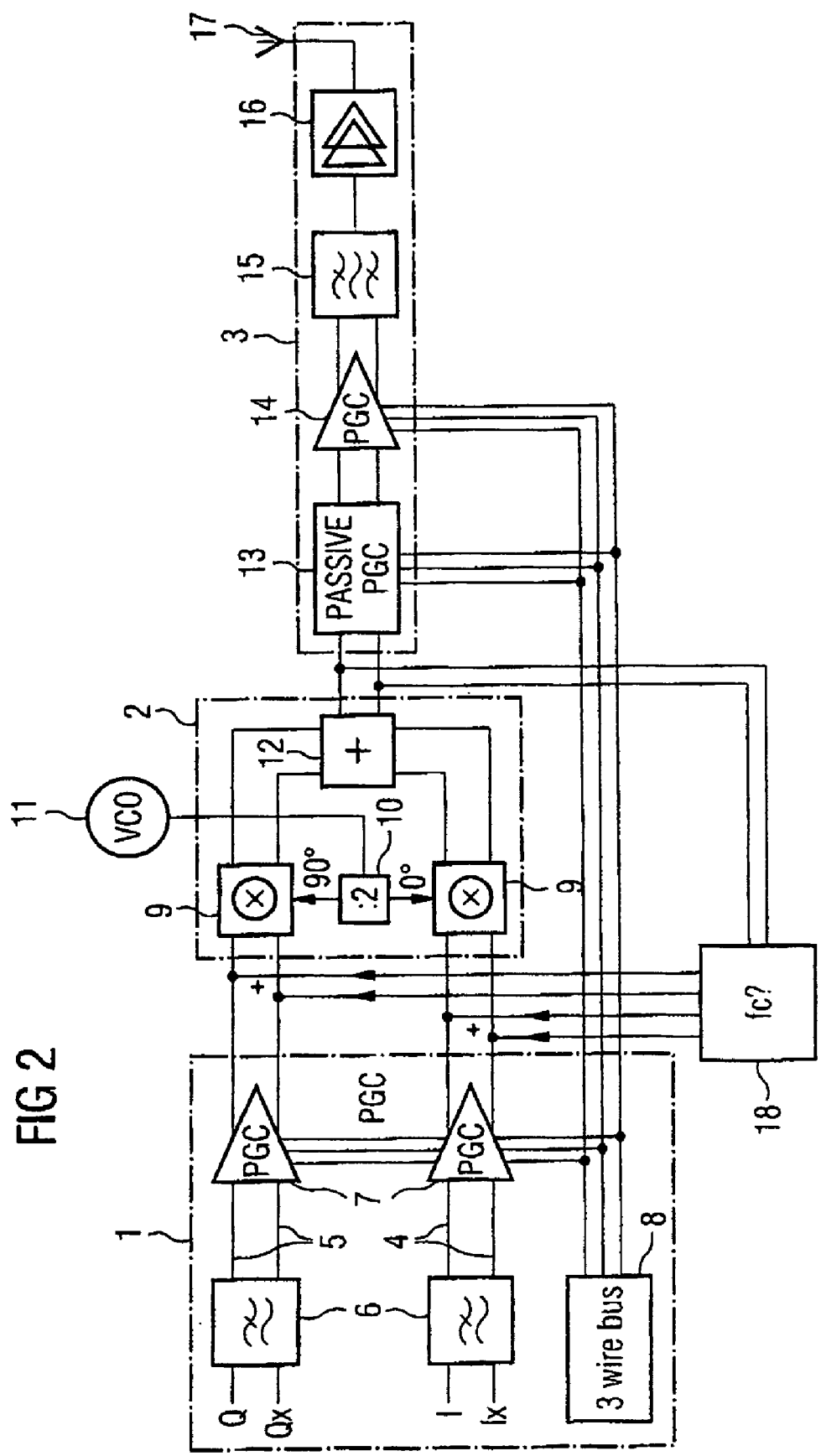
FIG. 2 shows a development of the transmission arrangement from FIG. 1 with carrier frequency suppression.

FIG. 2 shows a development of the transmission arrangement from FIG. 1 with an additional apparatus for carrier frequency suppression 18, which couples the output of the quadrature modulator 2 to its quadrature inputs. Apart from this development, the transmission arrangement in FIG. 2 corresponds, in terms of the elements it uses, the way in which these are connected, their functions and the advantageous interaction of the elements, to the transmission arrangement from FIG. 1, a description of which will therefore not be repeated at this point.

The additional loop for carrier frequency suppression comprises a feedback path, which comprises the means for carrier frequency suppression 18 and whose symmetrically designed input is connected to the output of the summation node 12. Provided at the output of the means for carrier suppression 18 are two output terminal pairs, which are respectively coupled to the inputs of the Gilbert mixers 9 using their symmetrical input pairs, for example (as FIG. 2 shows) using adding nodes which are connected to the outputs of the programmable amplifiers 7 by means of further inputs.

The means for carrier frequency suppression 18 detects components of the carrier frequency provided by the VCO 11 which possibly appears at the output of the quadrature modulator 2, and, on the basis thereof, influences the in-phase and quadrature components of the baseband signals in the signal paths 4 and 5. In this case, by way of example, an additional DC voltage offset may be introduced within the symmetrical components of the in-phase path 4 or within the symmetrical components of the quadrature path 5 or both.

Providing a carrier frequency suppression loop is advantageous, in particular, in combination with the programmable amplifiers 7, which may possibly result in a heightened appearance of frequency components at the carrier frequency at the output of the quadrature modulator 2.

FIG. 3 shows, by way of example, the design of a programmable amplifier with a multiplicity of amplifier paths which can be connected and disconnected independently of one another, which programmable amplifier may advantageously be used as first and/or second programmable amplifier 7, 14 in the transmission arrangements shown in FIGS. 1 and 2.

Specifically, the programmable amplifier shown in FIG. 3, which is designed using symmetrical circuitry, comprises a signal input 18 and a signal output 19, which has an electrical load 20 connected to it. The amplifier comprises three parallel-connected, symmetrical amplifier paths which are each formed from a series circuit comprising a cascode stage 21, a field effect transistor 22 and a power source 23. The transistors 22 are respectively associated with one another in pairs and have their control inputs connected to the signal input 18 in pairs. The current sources 23 are likewise associated with one another in pairs and each have control inputs for connecting and disconnecting the current sources 23 independently of one another in pairs, the control inputs being coupled to the control unit 8. In this arrangement, the control unit 8 provides a discrete-value, digital signal for gain control via a three-conductor bus. The control inputs of the current sources 23 are coupled to the control unit 8 by means of a decoder 24, which converts the serial signal supplied at its input by the three-conductor bus into a parallel signal, which is provided at its output.

Instead of the three pairs of amplifier paths 21, 22, 23 which are shown, it is possible to provide any number of amplifier paths, for example 16 amplifier path pairs 21, 22, 23. As already explained at the outset, the disconnection of the amplifier paths that are not needed for the present transmission power allows a marked power reduction for the transmission arrangement and hence, when the transmission arrangement is used in portable mobile radios, a much longer storage battery operating time or talking time.

As an alternative to the exemplary embodiments' gradation of the amplification and attenuation steps 1 dB and 6 dB, respectively, any other combination of step sizes may also be provided depending on the application, so long as the step size has discrete gradations.

Table 1 provides a list of reference symbols used in the drawings.

TABLE 1

| 1 | Baseband signal processing unit |
| 2 | Quadrature modulator |

TABLE 1-continued

| 3 | Radio frequency path |
| 4 | In-phase signal path |
| 5 | Quadrature signal path |
| 6 | Low pass filter |
| 7 | First programmable amplifier |
| 8 | Control unit |
| 9 | Mixer |
| 10 | 0 degree/90 degree divider |
| 11 | Voltage-controlled oscillator |
| 12 | Summation node |
| 13 | Passive, programmable amplifier |
| 14 | Second programmable amplifier |
| 15 | Bandpass filter |
| 16 | Power amplifier |
| 17 | Antenna |
| 18 | Signal input |
| 19 | Signal output |
| 20 | Load |
| 21 | Cascode stage |
| 22 | Transistor |
| 23 | Power source |
| 24 | Decoder |
| I | In-phase signal component |
| Q | Quadrature signal component |

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A transmission arrangement comprising:
   a baseband signal processing unit comprising
      an in-phase signal path and a quadrature signal path,
      a first programmable amplifier comprising a first control input configured to accept a first discrete valued digital gain control signal, the first programmable amplifier comprising an amplifier component arranged in the in-phase signal path and an amplifier component arranged in the quadrature signal path, and
      a passive, programmable attenuator comprising a control input configured to accept a second discrete valued digital gain control signal, passive, programmable attenuator comprising an attenuator component arranged in the in-phase signal path and an attenuator component arranged in the quadrature signal path;
   a quadrature modulator comprising
      a first input coupled to the in-phase signal path,
      a second input coupled to the quadrature signal path, and
      an output;
   a radio frequency path coupled to the output of the quadrature modulator, the radio frequency path comprising a second programmable amplifier configured to accept a third discrete valued digital gain control signal; and
   a control unit providing the first, second and third digital gain control signals.

2. The transmission arrangement of claim 1, wherein the control unit is configured to adjust the first and third discrete digital gain control signals in 1 dB increments, and the control unit is configured to adjust the second digital control signal in 6 dB increments.

3. The transmission arrangement of claim 1, wherein the baseband signal processing unit processes a useful signal which is to be transmitted.

4. The transmission arrangement of claim 1, wherein the radio frequency path contains a passive, programmable attenuator.

5. The transmission arrangement of claim 4, wherein the radio frequency path processes a useful signal which is to be transmitted, the radio frequency path having a control input which is coupled to the control unit in order to provide discrete-value signal attenuation.

6. The transmission arrangement of claim 1, wherein at least one of the first and/or the second programmable amplifier comprises a plurality of parallel-connected amplifier paths that can be coupled and decoupled independently of one another, the amplifier paths being coupled and decoupled on the basis of the discrete-value control signal.

7. The transmission arrangement of claim 1, wherein the second programmable amplifier includes a means for setting the rise time of the gain factor.

8. The transmission arrangement of claim 1, further comprising a feedback path.

9. The transmission arrangement of claim 8, wherein the feedback path comprises a means for carrier frequency suppression, having an input which is coupled to the output of the quadrature modulator and having an output which is coupled to the in-phase and the quadrature signal path.

10. The transmission arrangement of claim 1, wherein the transmission arrangement is a mobile radio transmitter.

11. The transmission arrangement of claim 1, wherein the first and second programmable amplifiers are adjustable in steps of 1 dB.

12. The transmission arrangement of claim 1, wherein the control unit is coupled to the inputs of the first and second programmable amplifiers by a digital three-conductor bus based on the 3Wire Bus Specification.

13. The transmission arrangement of claim 1, wherein the quadrature modulator comprises Gilbert multipliers.

14. The transmission arrangement of claim 1, wherein the passive programmable amplifier comprises a controllable resistor network.

15. A transmitter circuit comprising:
a baseband signal processing circuit comprising
an in-phase signal path and a quadrature signal path,
a first programmable amplifier comprising a first control input configured to accept a first discrete valued digital gain control signal, the first programmable amplifier comprising an amplifier component arranged in the in-phase signal path and an amplifier component arranged in the quadrature signal path, and
a passive, programmable attenuator comprising a control input configured to accept a second discrete valued digital gain control signal, passive, programmable attenuator comprising an attenuator component arranged in the in-phase signal path and an attenuator component arranged in the quadrature signal path;
a quadrature modulator configured to be coupled to an oscillator comprising
a first input coupled to the in-phase signal path,
a second input coupled to the quadrature signal path, and
an output;
a radio frequency circuit coupled to the output of the quadrature modulator, the radio frequency circuit comprising a second programmable amplifier configured to accept a third discrete valued digital gain control signal;
a digital control bus coupled to the first programmable amplifier, the second programmable amplifier and the passive, programmable attenuator;
a control unit coupled to the digital control bus, the control unit configured to provide the first, second and third digital gain control signals via the control bus.

16. The transmitter circuit of claim 15, wherein the digital control bus comprises a three-conductor bus based on the 3Wire Bus Specification.

17. The transmitter circuit of claim 16, wherein:
the baseband signal processing circuit is arranged on a first integrated circuit;
the quadrature modulator is arranged on a second integrated circuit; and
the radio frequency circuit is arranged on a third integrated circuit.

18. The transmitter circuit of claim 16, wherein the transmitter circuit is arranged on at least one integrated circuit.

19. A mobile radio transmitter comprising the transmitter circuit of claim 15.

* * * * *

UNITED STATES PATENT AND TRADEMARK OFFICE
CERTIFICATE OF CORRECTION

PATENT NO. : 7,555,272 B2  Page 1 of 1
APPLICATION NO. : 10/872815
DATED : June 30, 2009
INVENTOR(S) : Zdravko Boos It is certified that error appears in the above-identified patent and that said Letters Patent is hereby corrected as shown below:

On the Title Page, item (60) Related U.S. Application Data, delete "Provisional" and insert --Continuation of--.

Signed and Sealed this

Seventeenth Day of November, 2009

David J. Kappos
*Director of the United States Patent and Trademark Office*